United States Patent
Yang et al.

(10) Patent No.: US 10,368,460 B1
(45) Date of Patent: Jul. 30, 2019

(54) SLIDING APPARATUS, SERVER CASING, AND ELECTRONIC DEVICE USING THE SAME

(71) Applicant: HONGFUJIN PRECISION ELECTRONICS (TIANJIN) CO., LTD., Tianjin (CN)

(72) Inventors: Tzu-Cheng Yang, New Taipei (TW); Huang-Jyun Lu, New Taipei (TW); Chih-Min Lin, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 15/970,193

(22) Filed: May 3, 2018

(30) Foreign Application Priority Data

Apr. 9, 2018 (CN) .......................... 2018 1 0313454

(51) Int. Cl.
   *H05K 5/02* (2006.01)
   *H05K 7/14* (2006.01)
   *F16B 2/18* (2006.01)

(52) U.S. Cl.
   CPC .......... *H05K 7/1489* (2013.01); *F16B 2/185* (2013.01); *H05K 7/1401* (2013.01)

(58) Field of Classification Search
   CPC ...... H05K 7/1489; H05K 7/1401; F16B 2/185
   USPC ........................................................ 361/727
   See application file for complete search history.

(56) References Cited

U.S. PATENT DOCUMENTS

| | | | |
|---|---|---|---|
| 6,945,619 B1 * | 9/2005 | Chen .................... | A47B 88/487 312/334.47 |
| 7,703,734 B2 * | 4/2010 | Chen .................... | A47B 88/43 108/108 |
| 8,317,278 B2 * | 11/2012 | Enos .................... | A47B 88/493 312/333 |
| 8,848,378 B2 * | 9/2014 | Liao .................... | G06F 1/181 248/224.8 |
| 9,629,459 B2 * | 4/2017 | Chen .................... | H05K 7/1489 |
| 2010/0014231 A1 * | 1/2010 | Zhang .................... | G06F 1/181 361/679.02 |
| 2012/0145874 A1 * | 6/2012 | Eberle, Jr. .......... | H05K 7/1489 248/636 |
| 2013/0162131 A1 * | 6/2013 | Zhou .................... | G06F 1/183 312/304 |

* cited by examiner

*Primary Examiner* — Rockshana D Chowdhury
(74) *Attorney, Agent, or Firm* — ScienBiziP, P.C.

(57) ABSTRACT

A server casing using a sliding apparatus for easy insertion and removal of blade servers includes a chassis and the sliding apparatus. The chassis includes a blocking member. The sliding apparatus includes a first fastening plate, a second parallel fastening plate being mounted to the first fastening plate. A sliding plate is slidably connected to the second fastening plate. The sliding plate is received between first and second fastening plates and there is a locking member with first and second ends. The first end is rotatably connected to the second fastening plate and includes a locking portion, the second end is connected to the sliding plate. The locking portion can move between a locking position, where the locking member is locked by the blocking member, and an unlocking position, where the locking member is unlocked by the blocking member.

17 Claims, 6 Drawing Sheets

SLIDING APPARATUS, SERVER CASING, AND ELECTRONIC DEVICE USING THE SAME

FIELD

The subject matter herein generally relates to computer mountings.

BACKGROUND

A "Server Blade" refers to an entire server designed to fit on a small plug-and-play card. Several blade servers can be installed in one rack, sharing the same power supplies, monitor, keyboard, and other electronic components. However, large operating space is needed to lock or unlock the blade servers. A sliding apparatus and server casing using the sliding apparatus would be beneficial.

BRIEF DESCRIPTION OF THE DRAWINGS

Implementations of the present disclosure will now be described, by way of example only, with reference to the attached figures.

DETAILED DESCRIPTION

Figure 1:
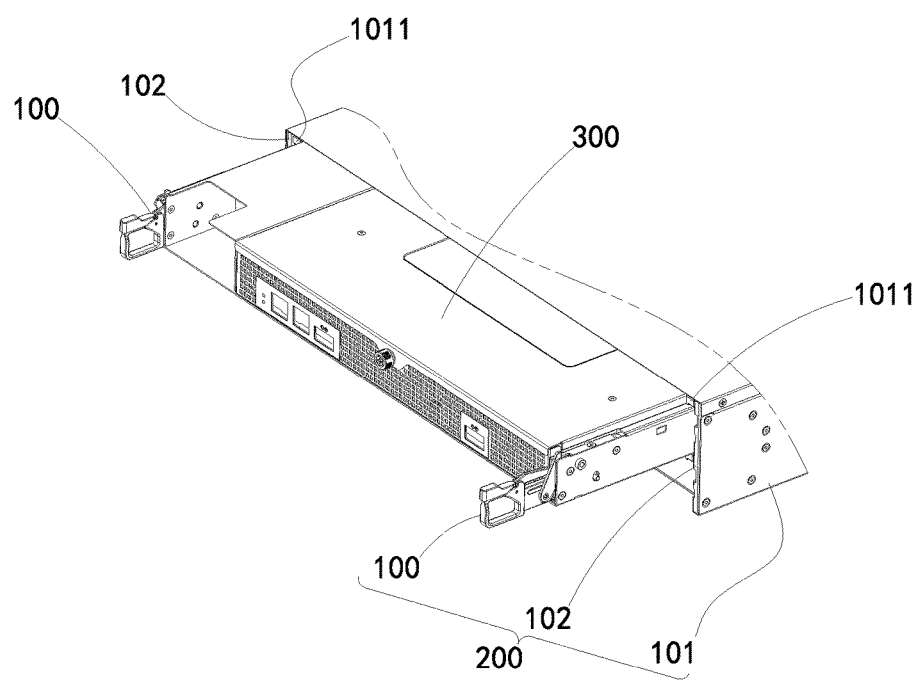
FIG. 1 illustrates an isometric view of an exemplary embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
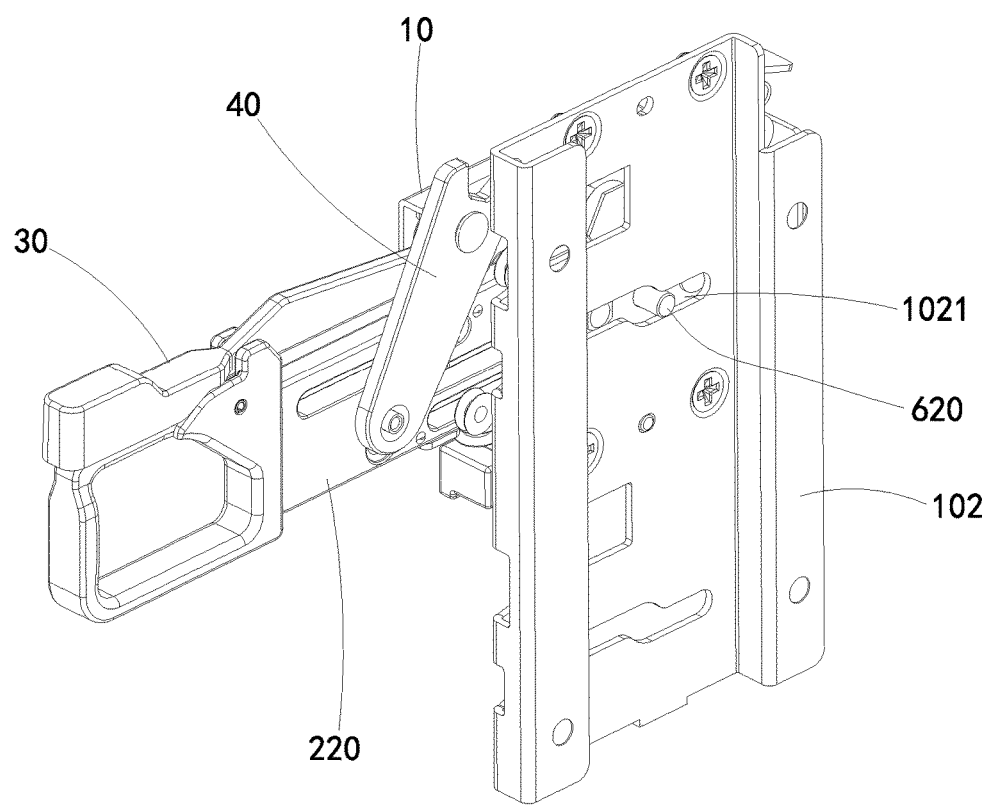
FIG. 2 illustrates an isometric view of a sliding apparatus and a guiding plate of the electronic device of FIG. 1.

FIGS. 1-2 illustrates an electronic device 500. The electronic device 500 includes a server casing 200 and an inserting unit 300. The inserting unit 300 can be a blade server or a storage device that can be inserted into the server casing 200.

The server casing 200 can include a chassis 101, a sliding apparatus 100, and a guiding plate 102. The sliding apparatus 100 can slide into and slide out of the chassis 101. The inserting unit 300 can be mounted to the sliding apparatus 100, and the inserting unit 300 can slide into and slide out of the chassis 101 together with the sliding apparatus 100.

Referring to FIGS. 3-6, the sliding apparatus 100 can include a first fastening plate 10, a second fastening plate 50, a sliding plate 20, a locking member 40, a latching unit 60, and a hook spring 70.

The second fastening plate 50 can be parallel with the first fastening plate 10 and mounted to the first fastening plate 10.

The sliding plate 20 is configured to be slidably connected to the second fastening plate 50 and be received between the first fastening plate 10 and the second fastening plate 50.

The locking member 40 can include a first end and a second end opposing the first end. The first end of the locking member 40 is rotatably connected to the second fastening plate 50, and the first end of the locking member 40 includes a locking portion 420. The second end of the locking member 40 is connected to the sliding plate 20.

When the sliding plate 20 slides on the second fastening plate 50, the sliding plate 20 drives the first end of the locking member 40 to rotate through the second end of the locking member 40. The first end of the locking member 40 drives the locking portion 420 to move between a locked position, where the locking member 40 is locked by the chassis 101, and an unlocked position, where the locking member 40 is unlocked by the chassis 101.

For example, the chassis 101 can include a blocking member 1011 (FIG. 1) corresponding to the locking member 40. The sliding apparatus 100 can slide into or slide out of the chassis 101 together with the inserting unit 300. When the sliding apparatus 100 and the inserting unit 300 are inserted in the chassis 101, the locking member 40 is moved to the locked position and the blocking member 1011 latches the locking member 40. When the sliding apparatus 100 and the inserting unit 300 are to be removed from the chassis 101, the locking member 40 can be moved to the unlocked position, and the blocking member 1011 releases the locking member 40.

The sliding apparatus 100 can slide into or slide out of the chassis 101 to connect the inserting unit 300 to the chassis 101 or to disconnect and extract the inserting unit 300 out of the chassis 101.

Figure 4:
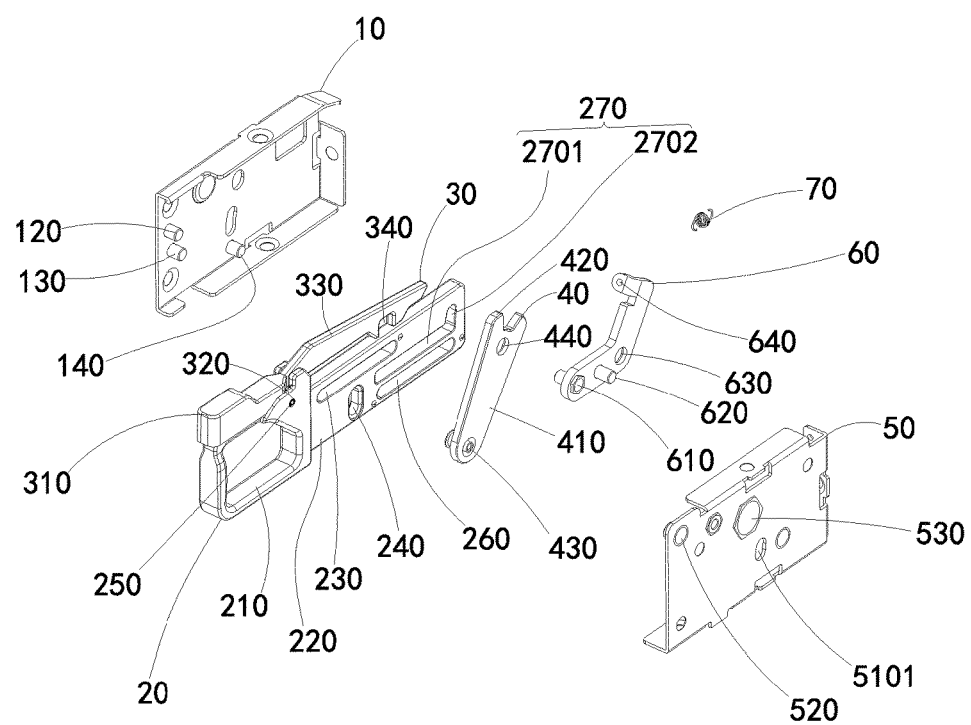
FIG. 4 illustrates an exploded view of the sliding apparatus of FIG. 3.

Referring to FIG. 4, The sliding plate 20 can define a first sliding slot 230 along an extending direction of the sliding plate 20. Correspondingly, the first fastening plate 10 can include a first guiding member 130, and the first guiding member 130 is slidably received in the first sliding slot 230.

The sliding plate 20 can further define a fourth sliding slot 260 along an extending direction of the sliding plate 20, and the fourth sliding slot 260 is parallel to the first sliding slot 230. Correspondingly, the first fastening plate 10 can include a second guiding member 140, and the second guiding member 140 is slidably received in the fourth sliding slot 260.

The latching unit 60 is mounted to the second fastening plate 50 and moveably connected to the sliding plate 20.

Figure 5:
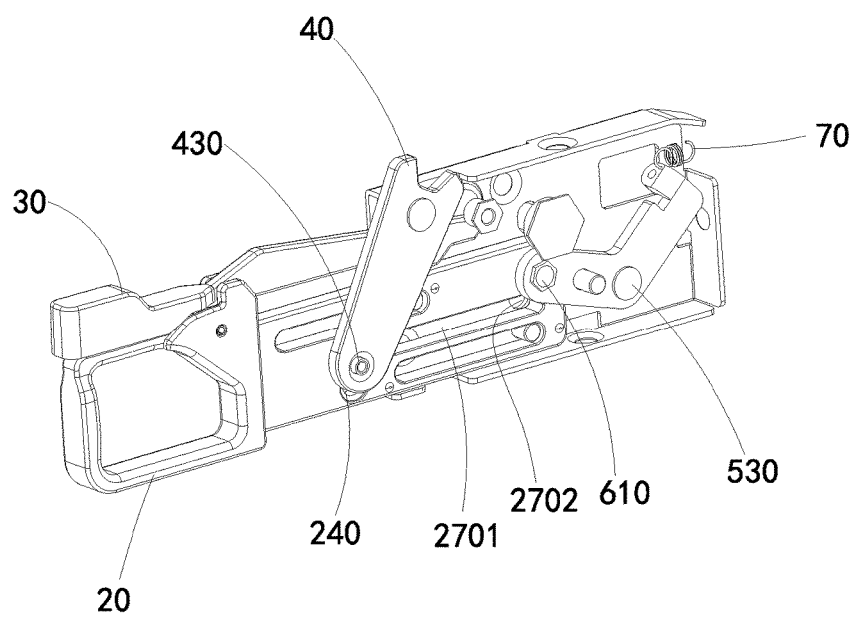
FIG. 5 illustrates an isometric view of a portion of the sliding apparatus of FIG. 3, specifically illustrating a latching unit in a latching position.
Figure 6:
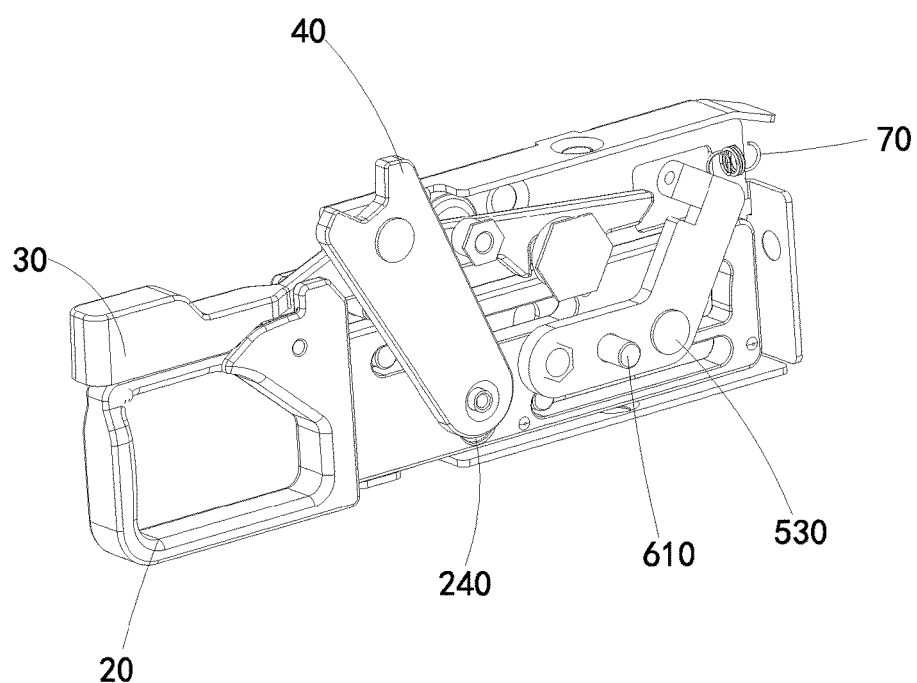
FIG. 6 illustrates an isometric view of a portion of the sliding apparatus of FIG. 3, specifically illustrating a latching unit in a releasing position.

The latching unit 60 is moveable between a latching position (as shown in FIG. 5), where the latching unit 60 latches the sliding plate 20 and prevents the sliding plate 20 from sliding, and a releasing position (as shown in FIG. 6), where the latching unit 60 releases the sliding plate 20 and the sliding plate 20 is thus free to move.

Figure 3:
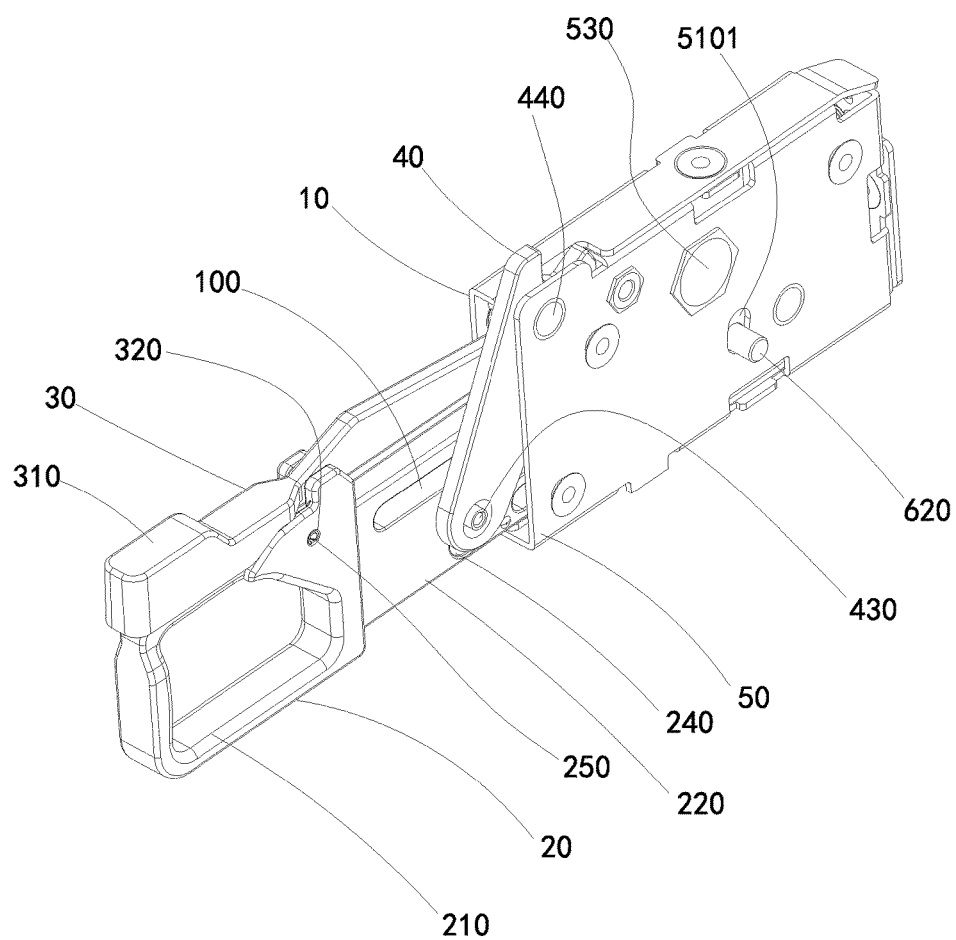
FIG. 3 illustrates an isometric view of the sliding apparatus of the electronic device of FIG. 1.

Referring to FIG. 2 in conjunction with FIG. 3, the guiding plate 102 defines a guiding slot 1021 configured to drive the latching unit 60 to move between the latching position and the releasing position.

Referring to FIG. 4, the locking member 40 can be a swing arm. The locking member 40 can further include a swing hole 440. The locking portion 420 can be located on a first end of the swing pole 410, the second end of the swing pole 410 can include a sliding portion 430.

The sliding plate 20 defines a second sliding slot 240. The second sliding slot 240 extends along a direction perpendicular to a sliding direction of the sliding plate 20. The sliding portion 430 is slidably received in the second sliding slot 240.

When the sliding plate 20 slides on the second fastening plate 50, the sliding plate 20 drives the sliding portion 430 through the second sliding slot 240.

The sliding plate 20 can include a sliding board 220 and a holder 210 connected to an end of the sliding board 220. The first sliding slot 230 and the second sliding slot 240 are defined on the sliding board 220.

In at least one exemplary embodiment, the sliding apparatus 100 can further include a latching member 30. The latching member 30 is connected to the sliding plate 20 and can move along with the sliding plate 20. The first fastening plate 10 can further include a first latching portion 120 and a second latching portion corresponding to the latching member 30.

Referring to FIG. 4, when the locking portion 420 is driven to move to the locking position, the latching member 30 is locked by one of the two latching portions, such as the second latching portion. When the locking portion 420 is driven to move to the unlocking position, the latching member 30 is locked by the other one of the two latching portions, such as the first latching portion 120.

The latching member 30 can include a cantilever 330 and a handle 310. The cantilever 330 includes two opposing ends. The handle 310 is connected to an end of the cantilever 330, the other end of the cantilever 330 is rotatably connected to the sliding plate 20. The other end of the cantilever 330 defines a latching slot 340 corresponding to the first latching portion 120 and the second latching portion.

When the locking portion 420 is driven to move to the locking position, the latching slot 340 is locked by the second latching portion. When the locking portion is driven to move to the unlocking position, the latching slot 340 is locked by the first latching portion 120.

An end of the cantilever 330 defines a first pivot hole 320. The holder 210 includes a first pivot pin 250 corresponding to the first pivot hole 320, and the cantilever 330 is rotatably connected to the holder 210 through the first pivot pin 250 and the first pivot hole 320.

In at least one exemplary embodiment, the sliding apparatus 100 can further include a resilient member(not shown). The resilient member can be connected between the holder 210 and the handle 310.

When the handle 310 is pressed to the holder 210, the resilient member being elastically deformed, and the cantilever 330 rotates about the first pivot pin 250 and drives the latching slot 340 to separate from one of the two latching portions. When the handle 310 is released, the resilient member drives the cantilever 330 to rotate in reverse under restoring force, and the latching slot 340 is driven to be locked by one of the two latching portions.

The locking member 40 defines a second pivot hole 440. The second fastening plate 50 can include a second pivot pin 520 corresponding to the second pivot hole 440. The locking member 40 is rotatably connected to the second fastening plate 50 through the second pivot pin 520 and the second pivot hole 440.

The latching unit 60 can include a sliding end 610, a rotating end 640, and a guiding pin 620.

The rotating end 640 is an end of the latching unit 60 opposite to the sliding end 610, and the guiding pin 620 is located between the sliding end 610 and the rotating end 640.

A middle portion of the latching unit 60 is rotatably connected to the second fastening plate 50. For example, the second fastening plate 50 includes a third pivot pin 530, and a middle portion of the latching unit 60 defines a third pivot hole 630. The latching unit 60 is rotatably connected to the second fastening plate 50 through the third pivot pin 530 and the third pivot hole 630.

The sliding board 20 defines a third sliding slot 270, the third sliding slot 270 includes a sliding section 2702 and a latching section 2701. When the guiding pin 620 is driven to move, the latching unit 60 rotates and the sliding end 610 is driven to move between the sliding section 2702 and the latching section 2701.

The hook spring 70 is between the rotating end 640 and the second fastening plate 50. The sliding end 610 is held at the latching section 2701 by the pretensioned hook spring when the sliding apparatus 100 is not being operated by users.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A sliding apparatus comprising:
   a first fastening plate;
   a second fastening plate parallel to the first fastening plate and mounted to the first fastening plate;
   a sliding plate slidably connected to the second fastening plate and received between the first fastening plate and the second fastening plate;
   a locking member comprising a first end and a second end, the second end being an end opposite to the first end; and
   a latching unit mounted to the second fastening plate and moveably connected to the sliding plate;
   wherein the latching unit is moveable between a latching position and a releasing position, the latching position is when the latching unit latches the sliding plate and prevent the sliding plate from sliding, and the releasing position is when the latching unit releases the sliding plate; the first end of the locking member is rotatably connected to the second fastening plate and comprising a locking portion, the second end of the locking member is connected to the sliding plate; when the sliding plate slides on the second fastening plate, the sliding plate drives the first end of the locking member to rotate through the second end of the locking member, and the first end of the locking member drives the locking portion to move between a locking position and an unlocking position;

wherein the sliding plate comprises a sliding board and a holder connected to an end of the sliding board; the sliding board defines a first sliding slot along an extending direction of the sliding board; the second fastening plate comprises a guiding member, and the guiding member is slidably received in the first sliding slot.

2. The sliding apparatus of claim 1, wherein the locking member is a swing arm comprising a swing hole, the locking portion is located on the first end of the swing pole, the second end of the swing pole comprises a sliding portion;

wherein the sliding board defines a second sliding slot, the second sliding slot extends along a direction perpendicular to a sliding direction of the sliding plate; the sliding portion is slidably received in the second sliding slot; and wherein when the sliding plate slides on the second fastening plate, the sliding plate drives the sliding portion through the second sliding slot.

3. The sliding apparatus of claim 1, wherein the latching unit comprises: a sliding end; a rotating end, the rotating end being an end opposite to the sliding end; and a guiding pin located between the sliding end and the rotating end; a middle portion of the latching unit is rotatably connected to the second fastening the sliding board defines a third sliding slot comprising a sliding section and a latching section; when the guiding pin is driven to move, the latching unit rotates and the sliding end is driven to move between the sliding section and the latching section.

4. The sliding apparatus of claim 3, wherein the sliding apparatus further comprises a latching member connected to the sliding plate; the second fastening plate further comprises two latching portions corresponding to the latching member;

when the locking portion is driven to move to the locking position, the latching member is locked by one of the two latching portions; when the locking portion is driven to move to the unlocking position, the latching member is locked by the other one of the two latching portions.

5. The sliding apparatus of claim 4, wherein the latching member comprises:

a cantilever comprising two opposite ends;
a handle connected to one end of the cantilever;
wherein the other end of the cantilever is rotatably connected to the sliding plate and defines a latching slot corresponding to the two latching portions;
when the locking portion is driven to move to the locking position, the latching slot is locked by one of the two latching portions; when the locking portion is driven to move to the unlocking position, the latching slot is locked by the other one of the two latching portions.

6. The sliding apparatus of claim 5, wherein an end of the cantilever defines a first pivot hole; the handle comprises a first pivot pin corresponding to the first pivot hole; and the cantilever is rotatably connected to the handle through the first pivot pin and the first pivot hole.

7. The sliding apparatus of claim 5, wherein the sliding apparatus further comprises an resilient member connected between the handle and the holder;

when the handle is pressed to the holder, the cantilever rotates about the pivot pin and drives the latching slot to separate from one of the two latching portions, and the resilient member is elastically deformed; when the handle is released, the resilient member drives the cantilever to rotate in reverse under restoring force, and the latching slot is driven to be locked by one of the two latching portions.

8. The sliding apparatus of claim 1, wherein the locking member defines a second pivot hole; the second fastening plate comprises a second pivot pin corresponding to the second pivot hole; and the locking member is rotatably connected to the second fastening plate through the second pivot pin and the second pivot hole.

9. A server casing comprising:

a chassis; and
a sliding apparatus comprising:
a first fastening plate;
a second fastening plate parallel with the first fastening plate and mounted to the first fastening plate;
a sliding plate configured to be slidably connected to the second fastening plate and be received between the first fastening plate and the second fastening plate;
a locking member comprising a first end and a second end opposing to the first end; and
a latching unit mounted to the second fastening plate and moveably connected to the sliding plate;
wherein the latching unit is moveable between a latching position, where the latching unit latches the sliding plate and prevent the sliding plate from sliding, and a releasing position, where the latching unit releases the sliding plate; the first end of the locking member is rotatably connected to the second fastening plate and comprising a locking portion, the second end of the locking member is connected to the sliding plate; when the sliding plate slides on the second fastening plate, the sliding plate drives the first end of the locking member to rotate through the second end of the locking member, and the first end of the locking member drives the locking portion to move between a locking position and an unlocking position; and
a guiding plate defining a guiding slot configured to drive the latching unit to move between the latching position and the releasing position;
wherein the sliding plate comprises a sliding board and a holder connected to an end of the sliding board; the sliding board defines a first sliding slot along an extending direction of the sliding board; the second fastening plate comprises a guiding member, and the guiding member is slidably received in the first sliding slot.

10. The server casing of claim 9, wherein the locking member is a swing arm comprising a swing hole, the locking portion is located on the first end of the swing pole, the second end of the swing pole comprises a sliding portion; the sliding board defines a second sliding slot, the second sliding slot extends along a direction perpendicular to a sliding direction of the sliding plate; the sliding portion is slidably received in the second sliding slot; when the sliding plate slides on the second fastening plate, the sliding plate drives the sliding portion through the second sliding slot.

11. The server casing of claim 9, wherein the latching unit comprises: a sliding end; a rotating end opposing to the sliding end; and a guiding pin located between the sliding end and the rotating end; a middle portion of the latching unit is rotatably connected to the second fastening plate; the sliding board defines a third sliding slot comprising a sliding section and a latching section; when the guiding pin is driven to move, the latching unit rotates and the sliding end is driven to move between the sliding section and the latching section.

12. The server casing of claim 11, wherein the sliding apparatus further comprises a latching member connected to the sliding plate; the second fastening plate further comprises two latching portions corresponding to the latching member;
  when the locking portion is driven to move to the locking position, the latching member is locked by one of the two latching portions; when the locking portion is driven to move to the unlocking position, the latching member is locked by the other one of the two latching portions.

13. The server casing of claim 12, wherein the latching member comprises:
  a cantilever comprising two opposing ends;
  a handle connected to an end of the cantilever;
  wherein the other end of the cantilever is rotatably connected to the sliding plate and defines a latching slot corresponding to the two latching portions;
  when the locking portion is driven to move to the locking position, the latching slot is locked by one of the two latching portions; when the locking portion is driven to move to the unlocking position, the latching slot is locked by the other one of the two latching portions.

14. The server casing of claim 13, wherein an end of the cantilever defines a first pivot hole; the handle comprises a first pivot pin corresponding to the first pivot hole; and the cantilever is rotatably connected to the handle through the first pivot pin and the first pivot hole.

15. The server casing of claim 13, wherein the sliding apparatus further comprises an resilient member connected between the handle and the holder;
  when the handle is presses to the holder, the cantilever rotates about the pivot pin and drives the latching slot to separate from one of the two latching portions, and the resilient member is elastically deformed; when the handle is released, the resilient member drives the cantilever to rotate in reverse under restoring force, and the latching slot is driven to be locked by one of the two latching portions.

16. The server casing of claim 9, wherein the locking member defines a second pivot hole; the second fastening plate comprises a second pivot pin corresponding to the second pivot hole; and the locking member is rotatably connected to the second fastening plate through the second pivot pin and the second pivot hole.

17. An electronic device comprising:
  a server casing comprising: a chassis; and
  a sliding apparatus comprising:
  a first fastening plate;
  a second fastening plate parallel with the first fastening plate and mounted to the first fastening plate;
  a sliding plate configured to be slidably connected to the second fastening plate and be received between the first fastening plate and the second fastening plate;
  a locking member comprising a first end and a second end opposing to the first end; and
  a latching unit mounted to the second fastening plate and moveably connected to the sliding plate;
  wherein the latching unit is moveable between a latching position, where the latching unit latches the sliding plate and prevent the sliding plate from sliding, and a releasing position, where the latching unit releases the sliding plate; the first end of the locking member is rotatably connected to the second fastening plate and comprising a locking portion, the second end of the locking member is connected to the sliding plate; when the sliding plate slides on the second fastening plate, the sliding plate drives the first end of the locking member to rotate through the second end of the locking member, and the first end of the locking member drives the locking portion to move between a locking position and an unlocking position; and
  a guiding plate defining a guiding slot configured to drive the latching unit to move between the latching position and the releasing position; and
  an inserting unit mounted to the sliding apparatus;
  wherein the sliding plate comprises a sliding board and a holder connected to an end of the sliding board; the sliding board defines a first sliding slot along an extending direction of the sliding board; the second fastening plate comprises a guiding member, and the guiding member is slidably received in the first sliding slot.

* * * * *